(12) United States Patent
Nirengi et al.

(10) Patent No.: US 9,680,098 B2
(45) Date of Patent: Jun. 13, 2017

(54) ELEMENT MANUFACTURING METHOD AND ELEMENT MANUFACTURING APPARATUS

(71) Applicant: DAI NIPPON PRINTING CO., LTD., Tokyo (JP)

(72) Inventors: Takayoshi Nirengi, Tokyo (JP); Toshihiko Takeda, Tokyo (JP); Hiroyoshi Nakajima, Tokyo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

(21) Appl. No.: 14/777,782

(22) PCT Filed: Mar. 28, 2014

(86) PCT No.: PCT/JP2014/059264
§ 371 (c)(1),
(2) Date: Sep. 17, 2015

(87) PCT Pub. No.: WO2014/157657
PCT Pub. Date: Oct. 2, 2014

(65) Prior Publication Data
US 2016/0172589 A1 Jun. 16, 2016

(30) Foreign Application Priority Data
Mar. 29, 2013 (JP) ................................. 2013-071979

(51) Int. Cl.
*H01L 51/00* (2006.01)
*H01L 51/52* (2006.01)
(Continued)

(52) U.S. Cl.
CPC .......... *H01L 51/001* (2013.01); *C23C 16/458* (2013.01); *H01L 51/0026* (2013.01);
(Continued)

(58) Field of Classification Search
CPC .. H01L 51/01; H01L 51/0026; H01L 51/0029
(Continued)

(56) References Cited

U.S. PATENT DOCUMENTS

| 6,149,010 A | 11/2000 | Tanaka et al. |
| 2006/0243377 A1* | 11/2006 | Matsuo ..................... B44C 1/17 |
| | | 156/235 |

(Continued)

FOREIGN PATENT DOCUMENTS

| JP | 09-142569 A1 | 6/1997 |
| JP | 2000-109173 A1 | 4/2000 |

(Continued)

OTHER PUBLICATIONS

English Translation of International Preliminary Report on Patentability, International Application No. PCT/JP2014/059254, dated Sep. 29, 2015 (5 pages).

(Continued)

*Primary Examiner* — Jerome Jackson, Jr.
*Assistant Examiner* — Bo Fan
(74) *Attorney, Agent, or Firm* — Burr & Brown, PLLC (57) ABSTRACT

An element manufacturing method and apparatus for efficiently manufacturing an element such as an organic semiconductor element. First, an intermediate product that includes a substrate and a protrusion extending in a normal direction of the substrate is provided. Next, in a stacking chamber conditioned to a vacuum environment, a stacked structure is formed by continuously stacking a lid member on the intermediate product at a side where the protrusion is provided. After this operation, the stacked structure is transported from the stacking chamber to a first pressure chamber coupled to the stacking chamber and conditioned to a first pressure higher than the pressure in the vacuum environment. Next, the stacked structure is further transported from the first pressure chamber to a separation chamber coupled to the first pressure chamber and conditioned to a vacuum
(Continued)

environment, and then the stacked structure is separated into the intermediate product and the lid member.

14 Claims, 8 Drawing Sheets

(51) Int. Cl.
  *H01L 51/56*  (2006.01)
  *C23C 16/458*  (2006.01)
(52) U.S. Cl.
  CPC ...... *H01L 51/0029* (2013.01); *H01L 51/5228* (2013.01); *H01L 51/56* (2013.01); *H01L 51/0024* (2013.01); *H01L 51/525* (2013.01); *H01L 51/5234* (2013.01)
(58) Field of Classification Search
  USPC .......................................................... 438/99
  See application file for complete search history.

(56) References Cited

U.S. PATENT DOCUMENTS

2007/0080356 A1   4/2007  Nakayama et al.
2008/0287028 A1*  11/2008 Ozawa .................. H01L 51/56
                                                          445/24
2010/0097411 A1   4/2010  Nakayama et al.
2012/0104942 A1   5/2012  Nakayama et al.
2012/0318447 A1   12/2012 Ozawa

FOREIGN PATENT DOCUMENTS

| | | |
|---|---|---|
| JP | 2006-309994 A1 | 11/2006 |
| JP | 2007-052996 A1 | 3/2007 |
| JP | 2008-288074 A | 11/2008 |
| JP | 2009-087996 A1 | 4/2009 |
| JP | 4340982 B2 | 10/2009 |
| JP | 2011-009498 A1 | 1/2011 |
| JP | 2011-151195 A1 | 8/2011 |
| WO | 2010/090223 A1 | 8/2010 |

OTHER PUBLICATIONS

International Search Report (Application No. PCT/JP2014/059264) dated Jul. 1, 2014.
Japanese Office Action (With English Translation), Japanese Application No. 2014-069979, dated Oct. 18, 2016 (8 pages).

* cited by examiner

ELEMENT MANUFACTURING METHOD AND ELEMENT MANUFACTURING APPARATUS

BACKGROUND OF THE INVENTION

Field of the Invention

The present invention relates to an element manufacturing method and element manufacturing apparatus for forming elements on a substrate that continuously extends.

Background Art

Processes in manufacturing such elements as organic semiconductor elements and inorganic semiconductor elements are performed generally under a vacuum environment to prevent impurities from entering the elements. For example, thin film deposition techniques under the vacuum environment, such as sputtering, vapor deposition, or other techniques are used as a method for forming cathodic electrodes, anodic electrodes, and semiconductor layers on a substrate. The vacuum environment is provided by using a vacuum pump or other means to evacuate the inside of an element manufacturing apparatus for a predetermined time.

In the manufacturing processes for the above elements, various steps are executed in addition to a film deposition step. These steps include ones that are traditionally executed under atmospheric pressure. In contrast, as discussed above a predetermined time period is spent to provide the vacuum environment. Accordingly, when, in addition to the film deposition step executed under the vacuum environment, the steps executed under atmospheric pressure are further included in the manufacturing processes for such an element, temporarily removing the element from the element manufacturing apparatus requires spending a great deal of time in replacing an internal environment of the element manufacturing apparatus with atmospheric air or evacuating the inside of the element manufacturing apparatus. To avoid occurrence of such a time, it is desirable that as many as possible of the element manufacturing steps be executed inside the element manufacturing apparatus. This enables reduction in the time and costs needed to obtain one element.

Examples of steps other than film deposition include the step of removing an organic semiconductor layer positioned on an auxiliary electrode. Patent Document 1, for example, describes such a step. When another electrode disposed on the organic semiconductor layer is a common electrode of a thin-film form, the auxiliary electrode is disposed to suppress a location-by-location difference in magnitude of a voltage drop developed across the common electrode. That is to say, connecting the common electrode to the auxiliary electrode at various locations allows the voltage drop across the common electrode to be reduced. Meanwhile, since the organic semiconductor layer is generally provided over an entire region of the substrate, the above-discussed removing step for removing the organic semiconductor layer on the auxiliary electrode needs to be executed to connect the common electrode to the auxiliary electrode.

A known method for removing the organic semiconductor layer present on an auxiliary electrode is by irradiating the organic semiconductor layer with light such as laser light. In this case, the organic semiconductor material constituting the organic semiconductor layer will be dispersed during the removal of the organic semiconductor layer by ablation. To prevent contamination with the organic semiconductor material that has been dispersed, therefore, it is preferable that the substrate be covered with some kind of material and then hermetically sealed in an appropriate manner. Patent Document 1, for example, proposes a method in which first a counter substrate is overlaid upon the substrate under a vacuum environment to constitute an overlay substrate, next while a space between the counter substrate and the substrate is being maintained under the vacuum atmosphere, the overlay substrate is taken out from the vacuum environment into the atmospheric air, and after this operation, the organic semiconductor layer is irradiated with laser light. On the basis of a differential pressure between the vacuum atmosphere and the atmospheric air, this method enables the counter substrate to be brought into strong and close contact with the substrate, thereby enabling reliable prevention of contamination with the organic semiconductor material that has been dispersed.

PRIOR ART DOCUMENTS

Patent Documents

Patent Document 1: JP No. 4340982

SUMMARY OF THE INVENTION

Problems to be Solved by the Invention

When, as described in Patent Document 1, part of the element manufacturing steps is executed in the atmospheric air, that is, outside the element manufacturing apparatus, a great deal of time is needed to replace the internal environment of the element manufacturing apparatus with atmospheric air or to evacuate the inside of the element manufacturing apparatus. For minimum time consumption, it is desirable that the step of sealing the substrate hermetically by utilizing the differential pressure be executed inside the element manufacturing apparatus. The method of sealing the substrate hermetically inside the element manufacturing apparatus by utilizing the differential pressure, however, has traditionally not been proposed.

The present invention has been made with the above in mind, and an object of the invention is to provide an element manufacturing method and element manufacturing apparatus for efficiently manufacturing an element such as an organic semiconductor element by hermetically sealing a substrate inside the element manufacturing apparatus by use of a differential pressure.

Means for Solving the Problem

The present invention includes an element manufacturing method for forming an element on a substrate that continuously extends. The method includes the steps of: providing an intermediate product that includes the substrate and a protrusion extending in a normal direction of the substrate; forming a stacked structure by continuously stacking a lid member on the intermediate product at a side where the protrusion is provided, in a stacking chamber conditioned to a vacuum environment; transporting the stacked structure from the stacking chamber to a first pressure chamber coupled to the stacking chamber and conditioned to a first pressure higher than a pressure existing in the vacuum environment; further transporting the stacked structure from the first pressure chamber to a separation chamber coupled to the first pressure chamber and conditioned to a vacuum environment; and separating the stacked structure into the intermediate product and the lid member, in the separation chamber. At a cross section of the stacked structure resulting from imaginarily cutting the stacked structure by a plane orthogonal to a direction in which the stacked structure is transported, a space between the intermediate product and the lid member is hermetically sealed from surroundings.

The present invention further includes an element manufacturing apparatus for forming an element on a substrate that continuously extends. The apparatus includes: a stacking mechanism that forms a stacked structure by continuously stacking a lid member on an intermediate product that includes the substrate and a protrusion extending in a normal direction of the substrate, the lid member being stacked on the intermediate product at a side where the protrusion is provided; a pressure application mechanism that includes a first pressure chamber coupled to a stacking chamber, conditioned to a first pressure higher than a pressure existing in a vacuum environment, and configured to accept the stacked structure transported from the stacking chamber; and a separation mechanism that separates the stacked structure into the intermediate product and the lid member, in a separation chamber coupled to the first pressure chamber, conditioned to a vacuum environment, and configured to accept the stacked structure transported from the first pressure chamber. At a cross section of the stacked structure resulting from imaginarily cutting the stacked structure by a plane orthogonal to a direction in which the stacked structure is transported, a space between the intermediate product and the lid member is hermetically sealed from surroundings.

In the present invention, the stacked structure may further include a support member continuously stacked on the intermediate product at a side opposite to the side where the protrusion is provided. In this case, the lid member and the support member may be bonded together at the cross section of the stacked structure resulting from imaginarily cutting the stacked structure by a plane orthogonal to the direction in which the stacked structure is transported.

In the present invention, the element may include: the substrate; a plurality of first electrodes each disposed on the substrate; an auxiliary electrode and the protrusion, both disposed between the first electrodes; an organic semiconductor layer disposed on the first electrode; and a second electrode disposed on the organic semiconductor layer and the auxiliary electrode. The intermediate product may include: the substrate; the plurality of first electrodes disposed on the substrate; the auxiliary electrode and protrusion disposed between the first electrodes; and the organic semiconductor layer disposed on the first electrode and the auxiliary electrode. In this case, the element manufacturing method according to the invention may further include a removing step for removing the organic semiconductor layer disposed on the auxiliary electrode, in the first pressure chamber. The element manufacturing apparatus according to the invention may further include a removal mechanism that removes the organic semiconductor layer disposed on the auxiliary electrode, in the first pressure chamber.

In the present invention, the auxiliary electrode in the invention may be partly covered with the protrusion. In this case, the removing step in the element manufacturing method according to the invention may include the step of irradiating with light the organic semiconductor layer on the auxiliary electrode disposed adjacently to the protrusion. The removal mechanism in the element manufacturing apparatus according to the invention may include a light irradiator that irradiates with light the organic semiconductor layer on the auxiliary electrode disposed adjacently to the protrusion.

In the present invention, the protrusion may be at least partly covered with the auxiliary electrode. In this case, the organic semiconductor layer on the auxiliary electrode positioned on the protrusion may be removed in the removing step of the element manufacturing method according to the present invention. The removal mechanism in the element manufacturing apparatus according to the invention may be configured to remove the organic semiconductor layer on the auxiliary electrode positioned on the protrusion.

In the present invention, the intermediate product may include the substrate, and the protrusion and a layer to be exposed to light, which are disposed on the substrate. In this case, the element manufacturing method according to the present invention may further include an exposure step for irradiating with exposure light the layer to be exposed to light in the first pressure chamber. The element manufacturing apparatus according to the invention may further include an exposure mechanism that irradiates with exposure light the layer to be exposed to light in the first pressure chamber.

In the present invention, a vapor deposition material may be disposed on a surface of the lid member that faces the intermediate product. In this case, the element manufacturing method according to the invention may further include a step of vapor-depositing the vapor deposition material on the substrate by irradiating the vapor deposition material with light in the first pressure chamber. The element manufacturing apparatus according to the invention may further include a vapor-deposition mechanism that vapor-deposits the vapor deposition material on the substrate by irradiating the vapor deposition material with light in the first pressure chamber.

Effect of the Invention

According to the present invention, an element such as an organic semiconductor element can be efficiently manufactured by hermetically sealing a substrate inside an element manufacturing apparatus by use of a differential pressure.

DETAILED DESCRIPTION OF THE INVENTION

Hereunder, the embodiment of the present invention will be described with reference to FIGS. 1 to 6. A layer configuration of an organic semiconductor element 40 manufactured according to the embodiment of the present invention will be first described. Here, a top-emission type of organic electroluminescent (EL) element will be described as an example of the organic semiconductor element 40.

Organic Semiconductor Element

Figure 1:
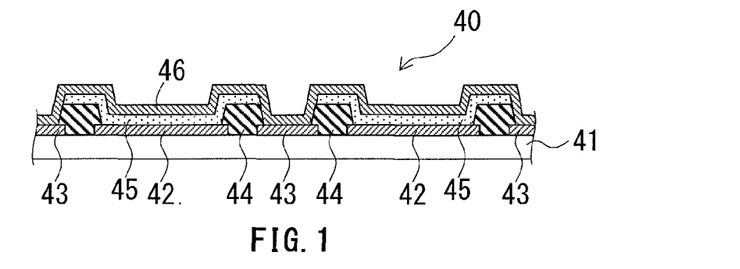
FIG. 1 is a vertical sectional view of an organic semiconductor element manufactured according to an embodiment of the present invention.

As shown in FIG. 1, the organic semiconductor element 40 includes a substrate 41, a plurality of first electrodes 42 disposed on the substrate 41, auxiliary electrodes 43 and protrusions 44 each disposed between the first electrodes 42, organic semiconductor layers 45 each disposed on one of the first electrodes 42, and a second electrode 46 disposed on the organic semiconductor layers 45 and the auxiliary electrodes 43.

The organic semiconductor layers 45 each include at least a light-emitting layer that emits light by recombinations of electrons and holes in organic compounds. Each organic semiconductor layer 45 may further include a hole injection layer, a hole transport layer, an electron transport layer or an electron implantation layer, and other layers generally provided in an organic EL element. Constituent elements of the organic semiconductor layer can be known ones, for example the elements described in JP-A-2011-9498.

One first electrode 42 is disposed for each of the organic semiconductor layers 45. The first electrode 42 functions as a reflecting electrode to reflect the light that has been generated from the organic semiconductor layer 45. Examples of a material constituting the first electrode 42 can include aluminum, chromium, titanium, iron, cobalt, nickel, molybdenum, copper, tantalum, tungsten, platinum, gold, silver, and any other metallic element as used alone, or an alloy of these elements.

The second electrode 46 functions as a common electrode with respect to the plurality of organic semiconductor layers 45. In addition, the second electrode 46 is configured to transmit the light that has been generated from the organic semiconductor layers 45. Examples of a material constituting the second electrode 46 can include a metallic film that has been thinned to such an extent that it can transmit the light, and an oxide conductive material such as indium tin oxide (ITO).

The auxiliary electrodes 43 are provided to suppress variations in voltage drop due to differences in distances from a power supply (not shown) to the individual organic semiconductor layers, and thus to suppress a variation in luminance of a display device which uses the organic EL element. As shown in FIG. 1, each auxiliary electrode 43 is connected to the second electrode 46. Examples of a material constituting the auxiliary electrode 43 can include substantially the same metallic elements as those which are each used alone in the first electrode 42, or an alloy of these elements. The auxiliary electrode 43 may be formed from the same material as that of the first electrode 42, or may be formed from a material different from that of the first electrode 42.

The protrusions 44 are constructed of a material having an electrical insulating property. In the example of FIG. 1, the protrusions 44 are each disposed between one first electrode 42 and one auxiliary electrode 43. Disposing each protrusion 44 enables electrical insulation between the first electrode 42, the auxiliary electrode 43, and the second electrode 46. The disposition of the protrusions 44 also enables appropriate definition of a shape of the organic semiconductor layers 45 each disposed between the protrusions 44. Examples of a material constituting the protrusions 44 can include an inorganic material such as polyimide, and an inorganic insulating material such as silicon oxide. In addition, the protrusions 44 extend in a normal direction of the substrate 41 and thus when a lid member described later herein is brought into close contact with the substrate 41, the protrusions can also be made to function as spacers to ensure a space between the lid member and the substrate 41.

As shown in FIG. 1, the organic semiconductor layers 45 and the second electrode 46 may be continuously disposed on the protrusions 44 as well as on the first electrodes 42. Of each organic semiconductor layer 45, only a region sandwiched between one first electrode 42 and the second electrode 46 allows an electric current to flow through and emits light, and regions of the organic semiconductor layer 45 that are positioned on the protrusions 44 do not emit light. Only the region of the organic semiconductor layer 45 that emits light is shown in FIGS. 2A and 2B that are described later herein.

Next, construction of the organic semiconductor element 40 when viewed from the normal direction of the substrate 41 is described below. The description focuses particularly upon layout of the auxiliary electrodes 43, protrusions 44, and organic semiconductor layers 45 of the organic semiconductor element 40. FIG. 2A is a plan view of the auxiliary electrodes 43, the protrusions 44, and the organic semiconductor layers 45, the plan view showing the layout of the three sections by way of example. As shown in FIG. 2A, the organic semiconductor layers 45 may be arranged sequentially in matrix form and each may include a rectangular, red organic semiconductor layer 45R, green organic semiconductor layer 45G, and blue organic semiconductor layer 45B. In this case, a combination of adjacent organic semiconductor layers 45R, 45G, and 45B constitutes one pixel.

Figure 2A:
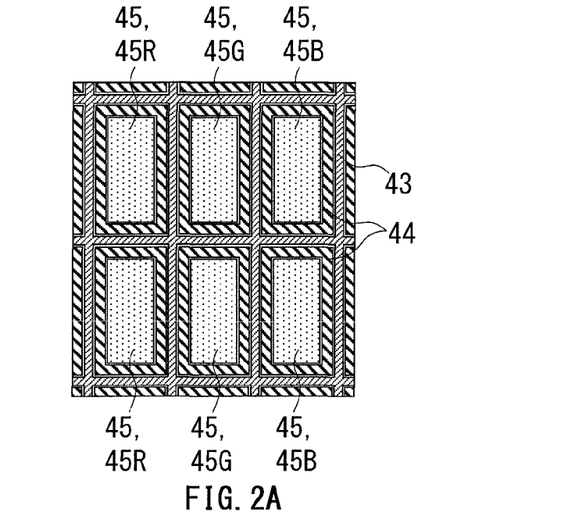
FIG. 2A is a plan view of auxiliary electrodes, protrusions, and organic semiconductor layers of the organic semiconductor element shown in FIG. 1, the plan view showing an example of layout of the three sections.
Figure 2B:
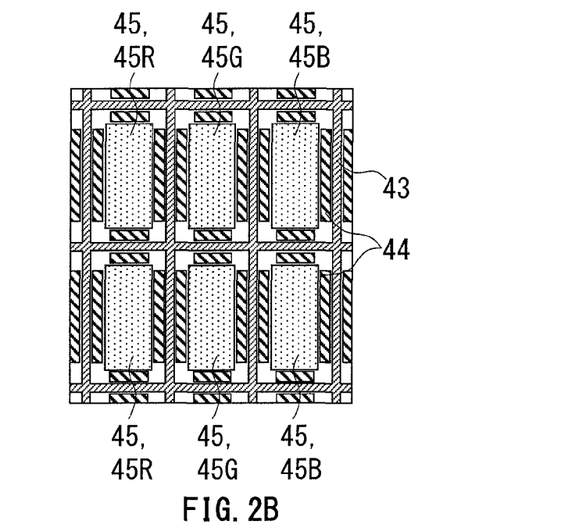
FIG. 2B is a plan view of the auxiliary electrodes, protrusions, and organic semiconductor layers of the organic semiconductor element shown in FIG. 1, the plan view showing another example of layout of the three sections.

As shown in FIG. 2A, the auxiliary electrodes 43 are arranged in grid form in such a way as to extend between the organic semiconductor layers 45 arranged in the matrix form. Location-specific differences in magnitude of the voltage drop across the second electrode 46 connected to the organic semiconductor layers 45 can be suppressed by arranging the auxiliary electrodes 43 in that way. Additionally, as shown in FIG. 2A, the protrusions 44 are each disposed between one organic semiconductor layer 45 and one auxiliary electrode 43 so as to surround the organic semiconductor layer 45 from a side. In other words, each protrusion 44 is continuously disposed along four sides of the organic semiconductor layer 45. Thus in the step of removing the organic semiconductor layer 45 positioned on the auxiliary electrode 43, the organic semiconductor material that has been dispersed can be prevented from reaching the organic semiconductor layer 45 on the first electrode 42.

As long as the voltage drop can be appropriately reduced, the auxiliary electrode 43 does not need to be connected to the second electrode 46 over an entire region of the auxiliary electrode 43. That is to say, not all of the organic semiconductor layer 45 on the auxiliary electrode 43 requires removal in the removing step detailed later herein. As shown in FIG. 2B, therefore, the protrusion 44 may be discontinuously disposed along the four sides of the organic semiconductor layer 45. In the example of FIG. 2B as well, in the step of removing the organic semiconductor layer 45 on the auxiliary electrode 43 positioned between the protrusions 44, the organic semiconductor material that has been dispersed can be prevented from reaching the organic semiconductor layer 45 on the first electrode 42. In addition, the voltage drop can be appropriately suppressed by connecting to the second electrode 46 the auxiliary electrode 43 positioned between the protrusions 44.

Next, an element manufacturing apparatus 10 and an element manufacturing method according to the embodiment, both intended to form the organic semiconductor element 40 on the substrate 41, will be described. Provided that impurities can be sufficiently prevented from entering the organic semiconductor element 40, although an environment in which the element manufacturing method is executed is not limited, the element manufacturing method is executed, for example, partially under a vacuum environment. For example, as long as the environment has a pressure lower than atmospheric pressure, although the more specific pressure in the vacuum environment is not limited, the element manufacturing apparatus 10 has an internal pressure of, for example, $1.0 \times 10^4$ Pa or less.

Element Manufacturing Apparatus

Figure 3:
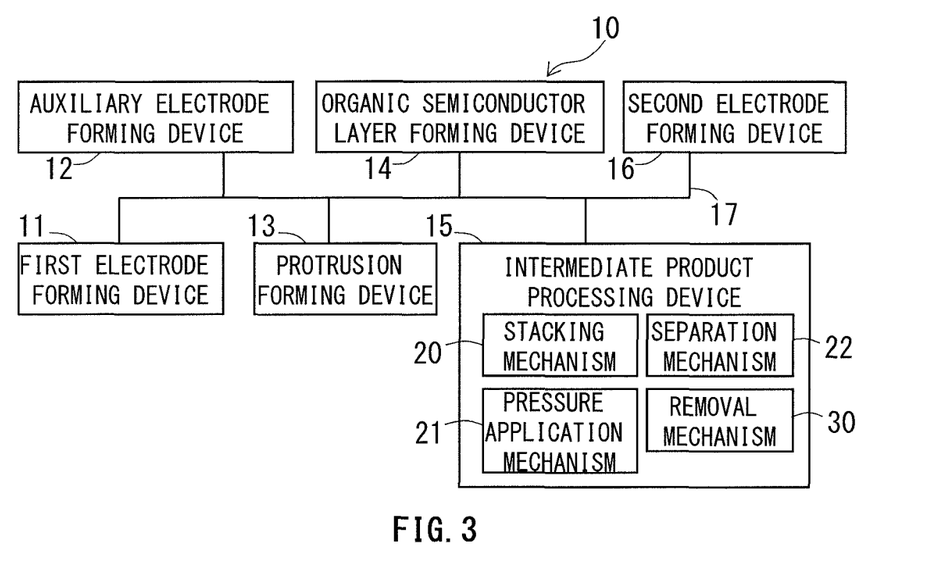
FIG. 3 is a diagram showing a configuration of an element manufacturing apparatus according to the embodiment of the present invention.

FIG. 3 is a diagram showing schematically a configuration of the element manufacturing apparatus 10. As shown in FIG. 3, the element manufacturing apparatus 10 includes: a first electrode forming device 11 that forms a plurality of the first electrodes 42 on the substrate 41; an auxiliary electrode forming device 12 that forms the auxiliary electrode 43 between the first electrodes 42; a protrusion forming device 13 that forms the protrusion 44 between the first electrode 42 and the auxiliary electrode 43; and an organic semiconductor layer forming device 14 that forms the organic semiconductor layer 45 on the first electrode 42, the auxiliary electrode 43, and the protrusion 44. In the following description, an object obtained in steps that use the devices 11, 12, 13, and 14 may be termed the intermediate product 50. The intermediate product 50 that has undergone processing in the first electrode forming device includes the substrate 41 and a plurality of the first electrodes 42 each disposed on the substrate 41. The intermediate product 50 that has undergone processing in the auxiliary electrode forming device 12 further includes the auxiliary electrode 43 formed between the first electrodes 42. The intermediate product 50 that has undergone processing in the protrusion forming device 13 further includes the protrusion 44 formed between the first electrode 42 and the auxiliary electrode 43. The intermediate product 50 that has undergone processing in the organic semiconductor layer forming device 14 further includes the organic semiconductor layer 45 formed on the auxiliary electrode 43 and the protrusion 44. In addition, when processing of the intermediate product 50 in an intermediate product processing device 15 is completed, the organic semiconductor layer 45 disposed on the auxiliary electrode 43 will have already been removed from the intermediate product 50.

The element manufacturing apparatus 10 further includes the intermediate product processing device 15 that performs predetermined processing while a lid member 25 described later herein is stacked upon the substrate 41. Here, a description will be given below of an example of the present embodiment in which the intermediate product processing device 15 is configured as a removal device to remove the organic semiconductor layer 45 disposed on the auxiliary electrode 43. In the present embodiment, the intermediate product processing device 15 includes a stacking mechanism 20, a pressure application mechanism 21, a separation mechanism 22, and a removal mechanism 30. Details of the mechanisms 20, 21, 22, and 30 will be described later herein. In addition, the element manufacturing apparatus 10 further includes a second electrode forming device 16 that after the removal of the organic semiconductor layer 45 on the auxiliary electrode 43, forms a second electrode 46 on the auxiliary electrode 43 and over remaining regions of the organic semiconductor layer 45.

As shown in FIG. 3, the element manufacturing apparatus 10 may further include a transport device 17 connected to the devices 11 to 16 in order to transport the substrate 41 and the intermediate product 50 between the devices 11 to 16.

FIG. 3 is a diagram representing a classification of the devices as viewed from a functional perspective, and the example shown in FIG. 3 does not limit a physical state of these devices. For example, more than one of the devices 11 to 16 shown in FIG. 3 may be physically configured as one device. Alternatively, any one or more of the devices 11 to 16 shown in FIG. 3 may be physically configured as a plurality of devices. For example, as will be described later herein, at least one of the first electrodes 42 and at least one of the auxiliary electrodes 43 may be formed at the same time in one step. In this case, the first electrode forming device 11 and the auxiliary electrode forming device 12 may be configured collectively as one device.

Element Manufacturing Method

Figure 4A:
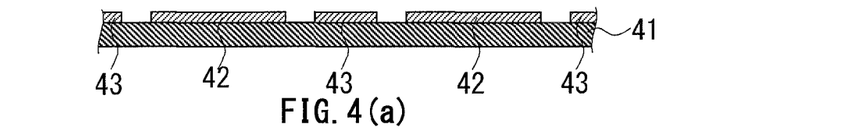
FIGS. 4(a) to 4(g) show various steps that constitute an element manufacturing method according to the embodiment of the present invention.

The method of manufacturing the organic semiconductor element 40 using the element manufacturing apparatus 10 will be described below with reference to FIGS. 4(a) to 4(g). The description here relates to a method of forming an organic semiconductor element 40 on a long-sized substrate 41 that continuously extends. First, a layer of a metallic material which constitutes first electrodes 42 and auxiliary electrodes 43 is formed on the substrate 41 by use of a sputtering method, for example, and then the layer of the metallic material is molded by etching. Thus the first electrodes 42 and the auxiliary electrodes 43 can be formed at the same time on the substrate 41, as shown in FIG. 4(a). The first electrodes 42 and the auxiliary electrodes 43 may be formed in steps independent of each other.

Figure 4B:
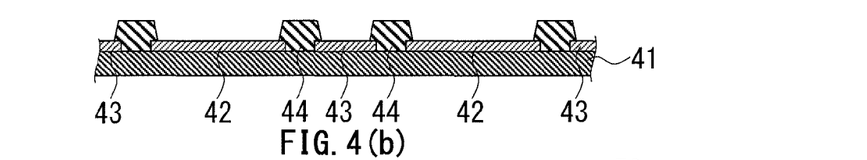
Figure 4C:
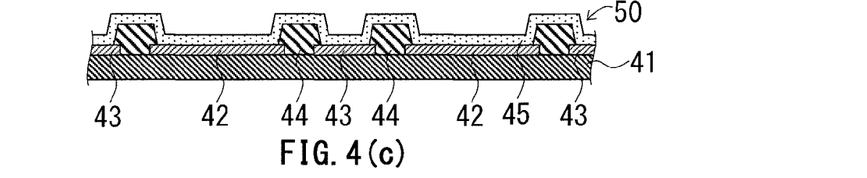

Next as shown in FIG. 4(b), a plurality of protrusions 44 each extending to a region above one of the first electrodes 42 and one of the auxiliary electrodes 43, in a normal direction of the substrate 41, are formed between the first electrode 42 and the auxiliary electrode 43 by means of photolithography, for example. After the formation of the protrusions 44, as shown in FIG. 4(c), an organic semiconductor layer 45 is formed on the first electrodes 42, the auxiliary electrodes 43, and the protrusions 44, by use of a general film-forming method such as physical vapor deposition, chemical vapor deposition (CVD), printing, inkjet coating, or transfer. In this manner, an intermediate product 50 can be obtained that includes the substrate 41, the first electrodes 42 disposed on the substrate 41, the auxiliary electrodes 43 and protrusions 44 each disposed between the first electrodes 42, and the organic semiconductor layer 45 disposed on the first electrodes 42, the auxiliary electrodes 43, and the protrusions 44. In the present embodiment, as described above, the first electrodes 42 and the auxiliary electrodes 43 are formed on the substrate 41 earlier than the protrusions 44. Accordingly the first electrodes 42 and the auxiliary electrodes 43 are partly covered with the protrusions 44.

Figure 4D:
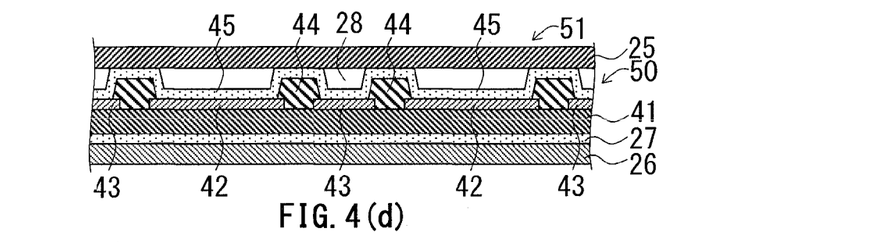
Figure 4E:
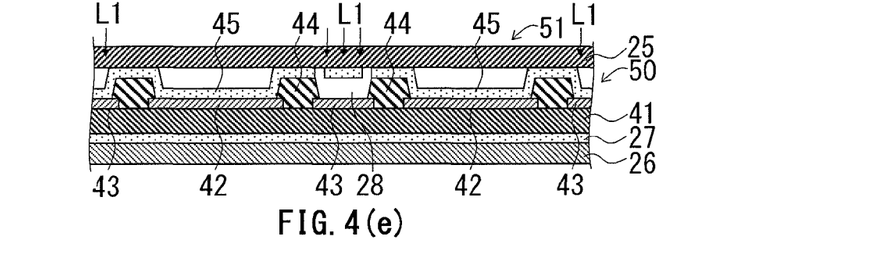

Next, a lid member 25 is provided and then as shown in FIG. 4(d), the lid member 25 is brought into close contact with the intermediate product 50 by use of the stacking mechanism 20 of the intermediate product processing device 15. Next while the lid member 25 is in close contact with the intermediate product 50, as shown in FIG. 4(e), the organic semiconductor layer 45 disposed on the auxiliary electrodes 43 is irradiated with light L1 such as laser light, by use of the removal, mechanism 30 of the intermediate product processing device 15. Energy from the light L1 is absorbed by the organic semiconductor layer 45, and consequently the organic semiconductor material constituting the organic semiconductor layer 45 on the auxiliary electrodes 43 is dispersed. In this way, the step of removing the organic semiconductor layer 45 on the auxiliary electrodes 43 can be executed. The organic semiconductor material that has been dispersed from the auxiliary electrodes 43 sticks to the lid member 25, as shown in FIG. 4(e), for example. After the organic semiconductor material has stuck to the lid member 25, the second electrode 46 is formed on the organic semiconductor layer 45 positioned on the first electrodes 42, and on the auxiliary electrodes 43, as will be described later herein.

Hereunder, the method of removing the organic semiconductor layer 45 on the auxiliary electrodes 43 with the lid member 25 remaining stacked on and in close contact with the intermediate product 50, as described per FIGS. 4(d) and 4(e), will be described in further detail with reference to FIGS. 5 and 6.

Stacking Step

First, the stacking step is executed to form a stacked structure 51 by stacking the lid member 25 on the intermediate product 50 by use of the stacking mechanism 20 of the intermediate product processing device 15. The stacking mechanism 20 is configured to continuously stack the lid member 25 on the intermediate product 50 at a side where the protrusions 44 are provided, in the stacking chamber 20a conditioned to a vacuum environment. As shown in FIG. 5, the stacking chamber 20a includes therein the following elements: evacuation means 20b that provides a vacuum environment in the stacking chamber 20a by evacuating air therefrom; an unwinder 50a that unwinds the long-sized intermediate product 50; a lid member unwinder 20c that unwinds the long-sized lid member 25; and one pair of stacking rollers 25e and 25e that hold the intermediate product 50 and the lid member 25 from both sides and then stack the lid member 25 on the intermediate product 50. As shown in FIG. 5, a long-sized support member 26 that has been unwound from a support member unwinder 20d may be further stacked continuously upon the intermediate product 50 at an opposite side with respect to the protrusions 44.

Figure 5:
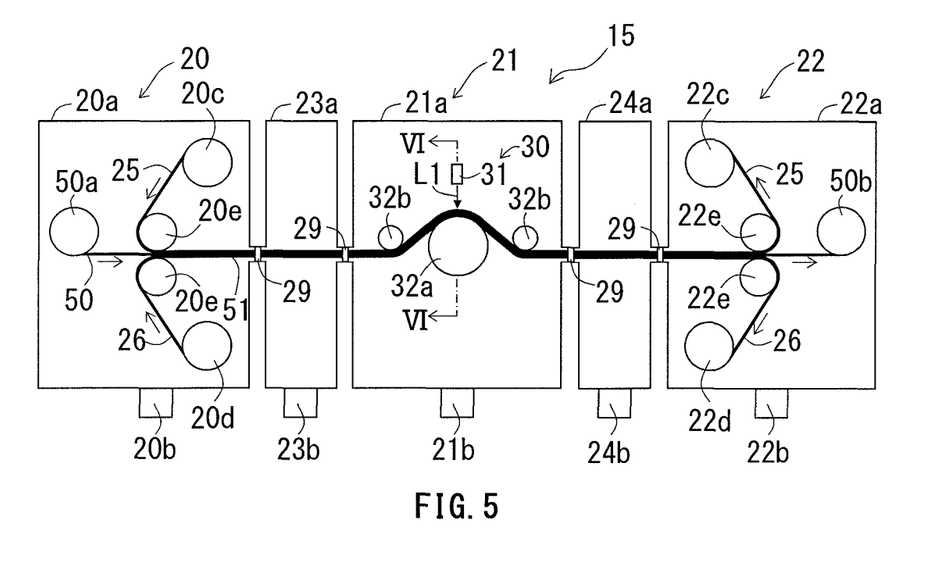
FIG. 5 is a diagram showing an intermediate product processing device of the element manufacturing apparatus shown in FIG. 3.
Figure 6:
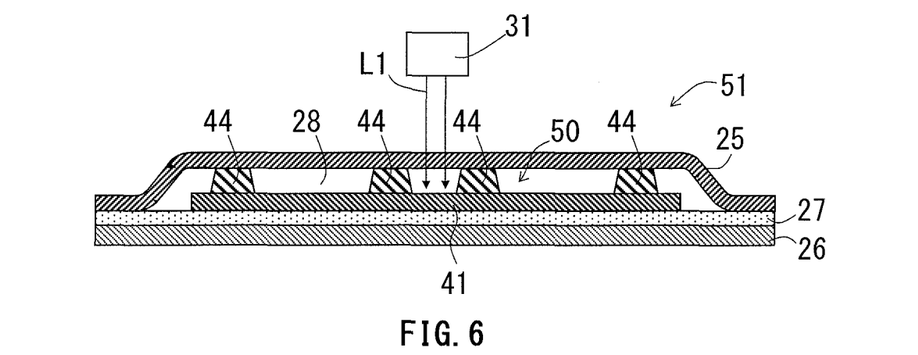
FIG. 6 is a cross-sectional view of a stacked structure shown in FIG. 5.

FIG. 6 is a cross-sectional view of the stacked structure 51 resulting from imaginarily cutting the stacked structure 51 by a plane orthogonal to a direction in which the stacked structure 51 is transported, that is, along line VI-VI in FIG. 5. As shown in FIG. 6, a sealing layer 27 having an adhesive property is disposed on a surface of the support member 26 that faces the intermediate product 50, and the intermediate product 50 is bonded onto the support member 26 via the sealing layer 27. In addition, as shown in FIG. 6, the lid member 25 covers the intermediate product 50 and at both ends of the lid member 25 extending in the transport direction of the stacked structure 51, the lid member 25 is bonded onto the support member 26 via the sealing layer 27. Thus an enclosed space 28 that is hermetically sealed from surroundings can be formed between the intermediate product 50 and the lid member 25. The sealing layer 27 may be absent if the lid member 25 or support member 26 itself has tackiness.

First Pressure Applying Step

Next, a first pressure applying step is executed to apply a first pressure higher than the pressure in a vacuum environment to the stacked structure 51 by use of the pressure application mechanism 21 of the intermediate product processing device 15. The pressure application mechanism 21 includes a first pressure chamber 21a coupled to the stacking chamber 20a and conditioned to the first pressure higher than the pressure in the vacuum environment. First pressure control means 21b that controls an internal pressure of the first pressure chamber 21a to the first pressure by, for example, introducing an inert gas into the first pressure chamber 21a, is disposed in the first pressure chamber 21a.

As shown in FIG. 5, the first pressure chamber 21a may be coupled to the stacking chamber 20a via a second pressure chamber 23a conditioned to a second pressure higher than the pressure in a vacuum environment and lower than the first pressure. Second pressure control means 23b that controls an internal pressure of the second pressure chamber 23a to the second pressure is disposed in the second pressure chamber 23a, as shown in FIG. 5. In addition, as shown in FIG. 5, a gate valve 29 for blocking an internal atmosphere of the stacking chamber 20a against that of the second pressure chamber 23a may be disposed between the stacking chamber 20a and the second pressure chamber 23a. Similarly a gate valve 29 for blocking the internal atmosphere of the second pressure chamber 23a against that of the first pressure chamber 21a may be disposed between the second pressure chamber 23a and the first pressure chamber 21a. Such disposition of the gate valves 29 allows the internal pressures of the stacking chamber 20a, the first pressure chamber 21a, and the second pressure chamber 23a, to be stably controlled to the vacuum environment, the first pressure, and the second pressure, respectively.

Figure 14:
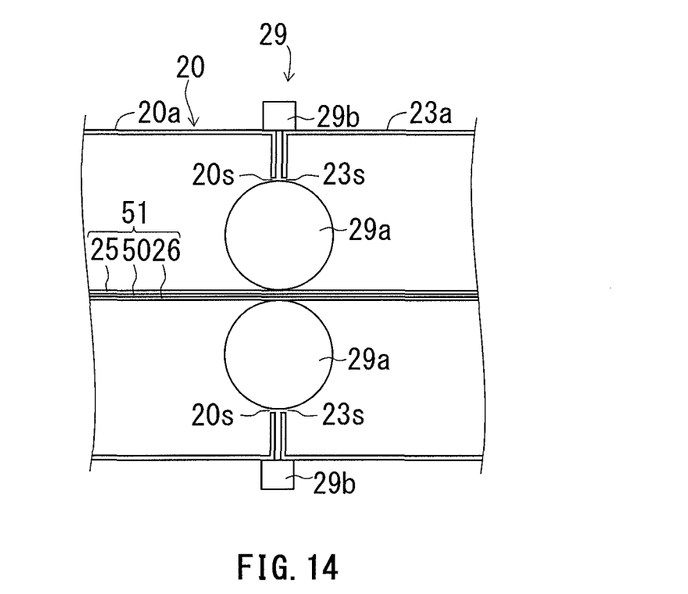
FIG. 14 is a diagram showing an example of a gate valve.

The gate valves 29 are appropriately configured to block the internal atmospheres against each other, between the above adjacent chambers. For example as shown in FIG. 14, the gate valve 29 between the stacking chamber 20a and the second pressure chamber 23a includes one pair of rollers 29a arranged so as to span the stacking chamber 20a and the second pressure chamber 23a. The stacked structure 51 is transported from the stacking chamber 20a, through a gap between the paired rollers 29a, to the second pressure chamber 23a. Interspaces 20s and 23s for enabling the rollers 29a to rotate may be formed between the rollers 29a, an outer wall of the stacking chamber 20a, and an outer wall of the second pressure chamber 23a. In this case, the gate valves 29 may further include exhaust means connected to the interspaces 20s, 23s. This will suppress an inflow of an external gas into the chambers 20a, 23a via the interspaces 20s, 23s, and movement of the gas between the chambers 20a, 23a via the interspaces 20s, 23s.

In the first pressure applying step, the stacked structure 51 is first transported from the stacking chamber 20a to the second pressure chamber 23a. In the second pressure applying step, the second pressure is applied to the stacked structure 51. Meanwhile, the stacked structure 51 is hermetically sealed in an orthogonal direction with respect to its transport direction as shown in FIG. 6. In addition, a separation chamber 22a in which the separation of the stacked structure 51 is performed as will be detailed later herein is conditioned to the vacuum environment, as with the stacking chamber 20a. In this case, the internal pressure of the stacked structure 51, for example the pressure between the intermediate product 50 and the lid member 25, is equivalent to the pressure in the vacuum environment. In the second pressure chamber 23a, therefore, the lid member 25 is in close contact with the intermediate product 50 on the basis of a difference between the pressure in the vacuum environment and the second pressure, i.e. on the basis of a pressure difference.

The stacked structure 51 is next transported from the second pressure chamber 23a to the first pressure chamber 21a. In the first pressure chamber 21a, the first pressure is applied to the stacked structure 51. The first pressure is higher than the second pressure, as described above. Accordingly, in the first pressure chamber 20a, the lid member 25 is in even closer contact with the intermediate product 50 on the basis of a differential pressure greater than that which has occurred in the second pressure chamber 23a.

Removing Step

Next, the removing step is executed to remove the organic semiconductor layer 45 on the auxiliary electrodes 43 of the intermediate product 50 in the first pressure chamber 21a by use of the removal mechanism 30 of the intermediate product processing device 15. The removal mechanism 30 removes the organic semiconductor layer 45 on the auxiliary electrodes 43 by irradiating the organic semiconductor layer 45 with the light L1 such as laser light, through the lid member 25. As shown in FIG. 6, the removal mechanism 30 includes a light irradiator 31 that generates laser light, for example. Examples of a material constituting the lid member 25 include a light-transmissive material such as polyethylene terephthalate (PET), cycloolefin polymer (COP), polypropylene (PP), polyethylene (PE), poly carbonate (PC), or glass film, so as to enable the light L1 such as laser light to pass through the lid member 25. The lid member 25 preferably has a predetermined gas barrier property to prevent a decrease in airtightness of the space between the intermediate product 50 and the lid member 25 due to an inflow of a gas from the lid member 25, and to prevent elements of the intermediate product 50 from suffering deterioration due to oxidation or other reasons. For example, the lid member 25 preferably has a maximum oxygen penetration of 100 cc/m$^2$·day, which is more preferably 30 cc/m$^2$·day and further preferably, 15 cc/m$^2$·day.

In the removing step, the stacked structure 51 is first guided toward a support roller 32a opposed to the light irradiator 31, by use of guide rollers 32b or the like. The stacked structure 51 supported by the support roller 32a is next irradiated with the light L1. More specifically as shown in FIGS. 4(e) and 6, the light L1 is emitted toward the organic semiconductor layer 45 on the auxiliary electrodes 43 arranged adjacently to the protrusions 44. In this way, the organic semiconductor layer 45 on the auxiliary electrodes 43 can be removed inside the element manufacturing apparatus 10, as shown in FIG. 4(e).

Separating Step

Executed following the removing step is the step of separating the stacked structure 51 into the intermediate product 50, the lid member 25, and the support member 26 by use of the separation mechanism 22 of the intermediate product processing device 15. The separation mechanism 22 is configured to separate the stacked structure 51 into the intermediate product 50, the lid member 25, and the support member 26, in the separation chamber 22a coupled to the first pressure chamber 21a and conditioned to a vacuum environment. The following elements are disposed in the separation chamber 22a: evacuation means 22b that provides the vacuum environment by evacuating air from the separation chamber 22a; one pair of separation rollers, 22e and 22e that separate the lid member 25 and the support member 26 from the intermediate product 50; a take-up section 50b that winds the intermediate product 50; a lid member take-up section 22c that winds the lid member 25 that has been separated from the intermediate product 50; and a support member take-up section 22d that winds the support member 26 that has been separated from the intermediate product 50.

As shown in FIG. 5, the separation chamber 22a may be coupled to the first pressure chamber 21a via a third pressure chamber 24a conditioned to a third pressure higher than the pressure in the vacuum environment and lower than the first pressure. Third pressure control means 24b that controls an internal pressure of the third pressure chamber 24a to the third pressure is disposed in the third pressure chamber 24a, as shown in FIG. 5. In addition, as shown in FIG. 5, a gate valve for blocking an internal atmosphere of the separation chamber 22a against that of the third pressure chamber 24a may be disposed between the separation chamber 22a and the third pressure chamber 24a. Similarly a gate valve 29 for blocking the internal atmosphere of the third pressure chamber 24a against that of the first pressure chamber 21a may be disposed between the third pressure chamber 24a and the first pressure chamber 21a. Such disposition of the gate valves 29 allows the internal pressures of the separation chamber 22a, the first pressure chamber 21a, and the third pressure chamber 24a to be stably controlled to the vacuum environment, the first pressure, and the third pressure, respectively.

In the separating step, the stacked structure 51 is first transported from the first pressure chamber 21a to the third pressure chamber 24a. In the third pressure chamber 24a, the third pressure is applied to the stacked structure 51. As described above, the third pressure is lower than the first pressure. In the third pressure chamber 24a, therefore, a close contact level of the lid member 25 with respect to the intermediate product 50 is reduced in comparison with a close contact level obtained in the first pressure chamber 21a.

Figure 4F:
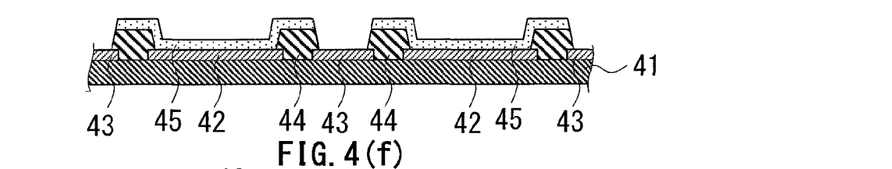

The stacked structure 51 is next transported from the third pressure chamber 24a to the separation chamber 22a. As described above, the internal pressure of the stacked structure 51, for example the pressure between the intermediate product 50 and the lid member 25, is equivalent to the pressure under which the stacked structure 51 is formed, that is, the internal pressure of the stacking chamber 20a in the vacuum environment. The separation chamber 22a is also conditioned to the vacuum environment, as described above. In the separation chamber 22a, therefore, substantially no differential pressure exists between the inside of the stacked structure 51 and surroundings thereof. This allows easy separation of the lid member 25 and the support member 26 from the intermediate product 50 in the separation chamber 22a. FIG. 4(f) shows the intermediate product 50 existing after the lid member 25 and the support member 26 have been separated.

Figure 4G:
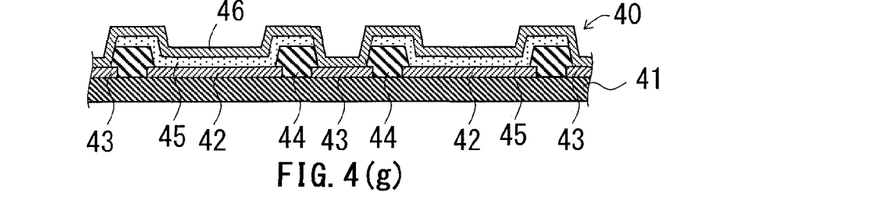

After the separating step, as shown in FIG. 4(g), the second electrode 46 is formed on the organic semiconductor layer 45 positioned on the first electrodes 42, and on the auxiliary electrodes 43. In this manner, the organic semiconductor element 40 with the auxiliary electrodes 43 connected to the second electrode 46 can be obtained.

In the present embodiment, since the first pressure chamber 21a conditioned to a pressure higher than that obtainable in a vacuum environment, and configured to accept the stacked structure 51 transported from the stacking chamber 20a, is disposed inside the element manufacturing apparatus 10, the lid member 25 can be brought into strong and close contact with the intermediate product 50 by utilizing the differential pressure. Accordingly, various processes such as the removing step can be performed upon the intermediate product 50 with the lid member 25 in strong and close contact therewith. This allows the suppression of contamination of the formed organic semiconductor layer 45 and the surrounding environment of the intermediate product 50. In addition, in the present embodiment, the element manufacturing element 40 can be continuously formed on the substrate 41 supplied on a roll-to-roll basis. The organic semiconductor element 40 can therefore be manufactured efficiently.

Furthermore, in the present embodiment, the second pressure chamber 23a conditioned to the second pressure higher than the pressure in a vacuum environment and lower than the first pressure is disposed between the stacking chamber 20a and the first pressure chamber 21a. Thus the pressure applied to the stacked structure 51 can be stepped up from the internal pressure of the stacking chamber 20a in the vacuum environment to the first pressure in the first pressure chamber 21a, whereby the lid member 25 can be brought into close contact with the intermediate product 50 more uniformly. Gas leakage from the inside of the first pressure chamber 21a into the stacking chamber 20a can also be suppressed. Similarly, in the present embodiment, the third pressure chamber 24a conditioned to the third pressure higher than the pressure in a vacuum environment and lower than the first pressure is disposed between the first pressure chamber 21a and the separation chamber 22a. Thus, gas leakage from the inside of the first pressure chamber 21a into the separation chamber 22a can be suppressed.

An example of disposing one pressure chamber between the stacking chamber 20a and the first pressure chamber 21a is shown in FIG. 5. This example, however, is not restrictive and a plurality of pressure chambers whose internal pressures are boosted stepwise may be disposed between the stacking chamber 20a and the first pressure chamber 21a. In this case, the pressure applied to the stacked structure 51 can be increased at finer (smaller) levels from the internal pressure of the stacking chamber 20a in the vacuum environment to the first pressure in the first pressure chamber 21a. The same also applies to the pressure chamber(s) present between the stacking chamber 20a and the separation chamber 22a. The second pressure chamber 23a and the third pressure chamber 24a may be absent in cases where the difference between the internal pressure of the stacking chamber 20a in the vacuum environment and the first pressure is insignificant and where any gas leakage between the stacking chamber 20a, the separation chamber 22a, and the first pressure chamber 21a, is suppressed to a sufficiently low level.

A variety of changes and the like may be introduced in the above embodiment. The following will describe modifications based on part of the accompanying drawings. In the following description and the drawings used therein, the same reference numbers as assigned to the elements that can be configured similarly and equivalently to those of the above embodiment will be used for these corresponding elements of the above embodiment, and overlapped description of these elements will be omitted. In addition, where the operational effects obtained in the above embodiment can also be obviously obtained in the modifications, description of these effects may be omitted.

A Modification of the Layer Configuration in the Stacked Structure

The example where the stacked structure 51 includes the intermediate product 50, the lid member 25, and the support member 26, and the enclosed space 28 is formed by bonding the lid member 25 and the support member 26 together, has been shown and described in the above embodiment. This example, however, does not limit a more specific layer configuration of the stacked structure 51 as long as the enclosed space 28 hermetically sealed from surroundings can be formed between the intermediate product 50 and the lid member 25.

Figure 8:
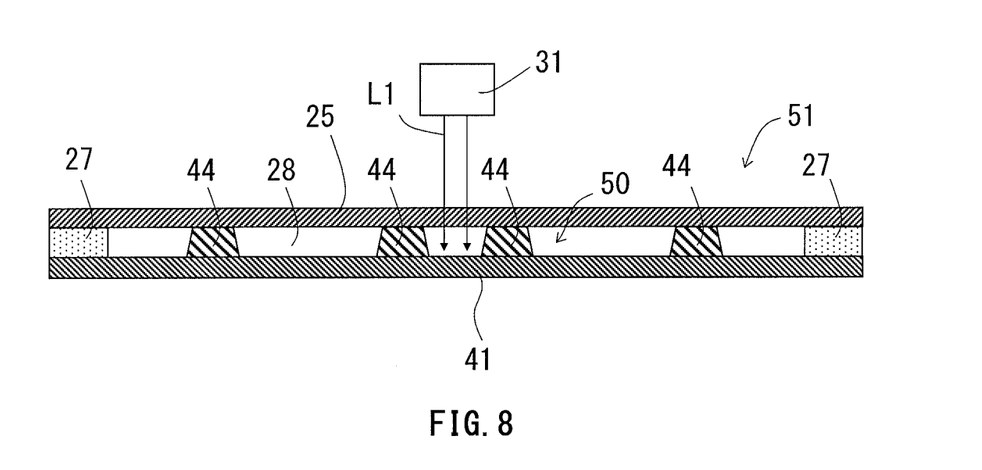
FIG. 8 is a cross-sectional view of a stacked structure shown in FIG. 7.

For example as shown in FIG. 8, the lid member 25 and the intermediate product 50 may be bonded together at the cross section of the stacked structure 51 resulting from imaginarily cutting the stacked structure by a plane orthogonal to the direction in which the stacked structure 51 is transported. In this case, as shown in FIG. 8, at both ends of the lid member 25 extending in the transport direction of the stacked structure 51, the lid member 25 is bonded onto a corresponding region of the intermediate product 50, for example both ends of the intermediate product 50, via the sealing layer 27. Thus the enclosed space 28 hermetically sealed from surroundings can be formed between the intermediate product 50 and the lid member 25. The sealing layer 27 may be absent if the lid member 25 itself or the substrate 41 itself of the intermediate product 50 has tackiness.

Figure 7:
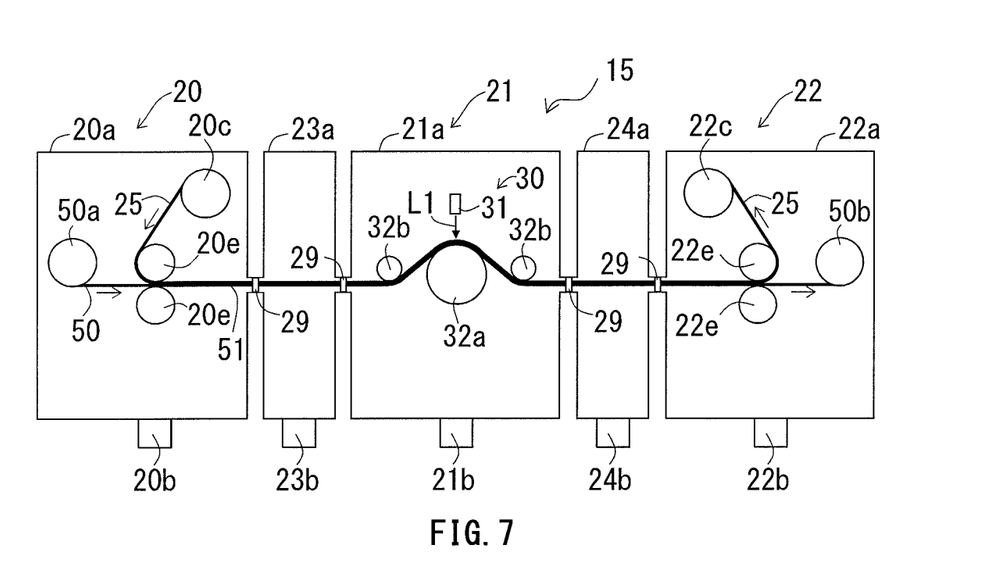
FIG. 7 is a diagram showing a modification of the intermediate product processing device of the element manufacturing apparatus shown in FIG. 3.

FIG. 7 is a diagram showing the intermediate product processing device 15 including the stacking mechanism 20 used to form the stacked structure 51 shown in FIG. 8, and the separation mechanism 22 used to separate the stacked structure 51 of FIG. 8 into the intermediate product 50 and the lid member 25. Except that the support member 26, the support member unwinder 20d, and the support member take-up section 22d are not disposed, the intermediate product processing device 15 shown in FIG. 7 is substantially the same as the intermediate product processing device 15 shown in FIG. 5, and thus, detailed description of the intermediate product processing device 15 shown in FIG. 7 will be omitted.

When the stacked structure shown in FIG. 8 is separated into the intermediate product 50 and the lid member 25, if the sealing layer 27 remains on the intermediate product side, the intermediate product region where the sealing layer 27 is disposed may be cut off in a step that follows the separation.

A Modification of the Layer Configuration in the Organic Semiconductor Element

The example where the first electrodes 42 and the auxiliary electrodes 43 are formed on the substrate 41 earlier than the protrusions 44 has been shown and described in the above embodiment. This example, however, is not restrictive and in a modification, the protrusions 44 may be formed on the substrate 41 earlier than the first electrodes 42 and the auxiliary electrodes 43. The close-fitting step and removing step in the embodiment can be used in such a modification as well. This modification will be described below with reference to FIGS. 9(a) to 9(g).

Figure 9A:
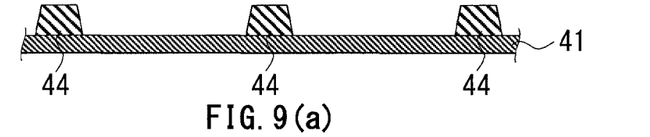
FIGS. 9(a) to 9(g) show various steps associated with the step of removing part of an organic semiconductor layer on auxiliary electrodes in a modification of the second embodiment of the present invention.
Figure 9B:
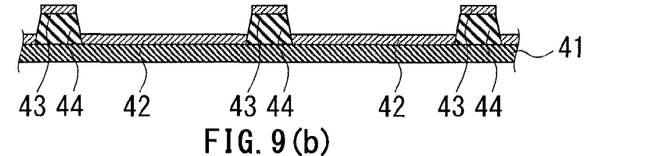
Figure 9C:
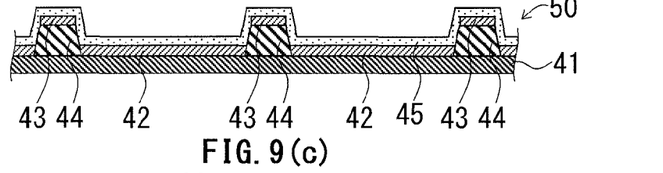

First as shown in FIG. 9(a), a plurality of protrusions 44 are formed on a substrate 41. Next as shown in FIG. 9(b), a first electrode 42 is formed between the protrusions 44. In addition, an auxiliary electrode 43 is formed on each of the protrusions 44. After the formation of the electrodes 42 and 43, as shown in FIG. 9(c), an organic semiconductor layer 45 is formed on the first electrodes 42, the auxiliary electrodes 43, and the protrusions 44. In this way, an intermediate product 50 can be obtained that includes the substrate 41, the first electrodes 42 disposed on the substrate 41, the auxiliary electrodes 43 and protrusions 44 disposed between the first electrodes 42, and the organic semiconductor layer 45 disposed on the first electrodes 42 and the auxiliary electrodes 43. In the present modification, the protrusions 44 are formed earlier than the first electrodes 42 and the auxiliary electrodes 43, and thus the protrusions 44 are covered with the auxiliary electrodes 43. The protrusions 44 do not need to have their upper surfaces covered with the auxiliary electrodes 43 over respective entire regions. In other words, the upper surfaces of the protrusions 44 need only to be at least partly covered with the auxiliary electrodes 43. In addition, an example of disposing the protrusions 44 in two rows between the first electrodes 42 and disposing the auxiliary electrode 43 between the protrusions 44 has been shown and described in the above embodiment, but in the present modification, since one auxiliary electrode 43 is disposed on each of the protrusions 44, the protrusions 44 may only be disposed in one row between the first electrodes 42, as shown in FIG. 9(c).

Figure 9D:
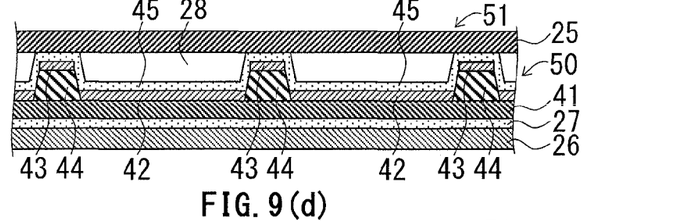
Figure 9E:
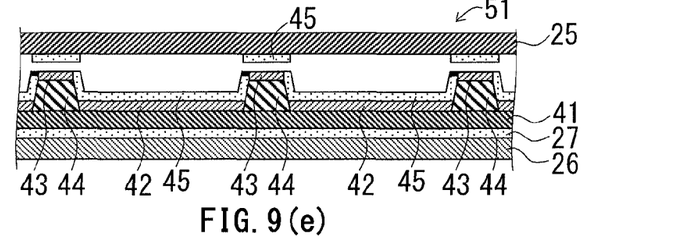
Figure 9F:
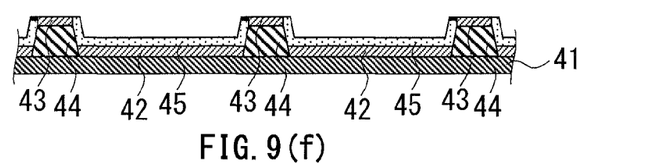

The stacking step for forming a stacked structure 51 by stacking the lid member 25 and the support member 26 on the intermediate product 50 by use of the stacking mechanism 20 is next executed. The first pressure applying step for applying the first pressure higher than the pressure in a vacuum environment to the stacked structure 51 by use of the pressure application mechanism 21 is executed after the stacking step. Consequently the lid member 25 is pressed firmly against the intermediate product 50, as shown in FIG. 9(d). Next, the removing step for removing the organic semiconductor layer 45 disposed on the auxiliary electrodes 43 of the intermediate product 50 is executed in the first pressure chamber 21a. In this case, as shown in FIG. 9(e), the organic semiconductor layer 45 on the auxiliary electrodes 43 positioned on the protrusions 44 can be transferred to the lid member side by setting appropriate surface energy of the surface of the lid member 25 that is opposed to the intermediate product 50. That is to say, in the present modification, the transfer can be used to execute the step of removing the organic semiconductor layer 45 disposed on the auxiliary electrodes 43 of the intermediate product 50. After the transfer, the stacked structure 51 is separated into the intermediate product 50, the lid member 25, and the support member 26, and thus the intermediate product 50 shown in FIG. 9(f) can be obtained. In the present modification as well, for accelerated transfer, the organic semiconductor layer 45 on the auxiliary electrodes 43 positioned on the protrusions 44 may be irradiated with light, as in the above embodiment.

Figure 9G:
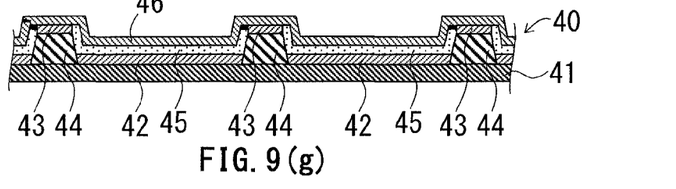

Then, as shown in FIG. 9(g), the second electrode 46 is formed on the organic semiconductor layer 45 overlaid on the first electrodes 42, and on the auxiliary electrodes 43 overlaid on the protrusions 44. In this manner, the organic semiconductor element 40 with the auxiliary electrodes 43 connected to the second electrode 46 can be obtained.

While the example where the organic semiconductor layer 45 removed is in contact with the auxiliary electrodes 43 has been shown and described in the above embodiment and in the present modification, this example is not limitative and any other layer that is not shown, such as a layer having an electrically conductive property, may be interposed between the organic semiconductor layer 45 removed and the auxiliary electrodes 43. Briefly the phrasing of "removing the organic semiconductor layer disposed on the auxiliary electrodes" as used herein means removing the organic semiconductor layer region that appears as if it overlapped with the auxiliary electrodes when viewed along the normal direction of the substrate.

Figure 10:
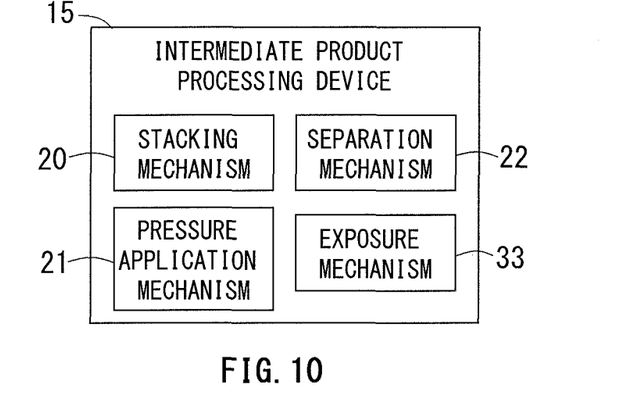
FIG. 10 is a diagram showing an example in which the intermediate product processing device is configured as an exposure device to irradiate with exposure light a layer to be exposed to light.
Figure 11:
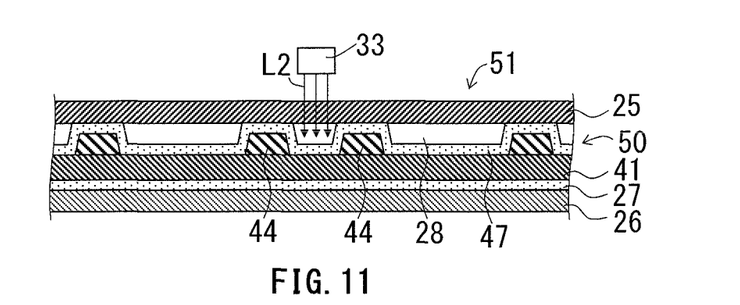
FIG. 11 is a diagram showing an exposure step executed by the exposure device shown in FIG. 10.

A Modification in which the Intermediate Product Processing Device is Configured as an Exposure Device The example where the intermediate product processing device 15 including the stacking mechanism 20, the pressure application mechanism 21, and the separation mechanism 22 is configured as the removal device to remove the organic semiconductor layer 45 lying on the auxiliary electrodes 43, has been shown and described in the above embodiment and in a modification. This example, however, do not limit applications of the stacking mechanism 20, the pressure application mechanism 21, or the separation mechanism 22. For example as shown in FIGS. 10 and 11, the intermediate product processing device 15 may include the stacking mechanism 20, the pressure application mechanism 21, the separation mechanism 22, and an exposure mechanism 33 that executes an exposure step in which it irradiates an intended layer 47 with exposure light L2 in the first pressure chamber 21a of the pressure application mechanism 21. In other words, the first pressure applying step in the first pressure chamber 21a, based on a differential pressure, may be used for the exposure step.

Figure 12:
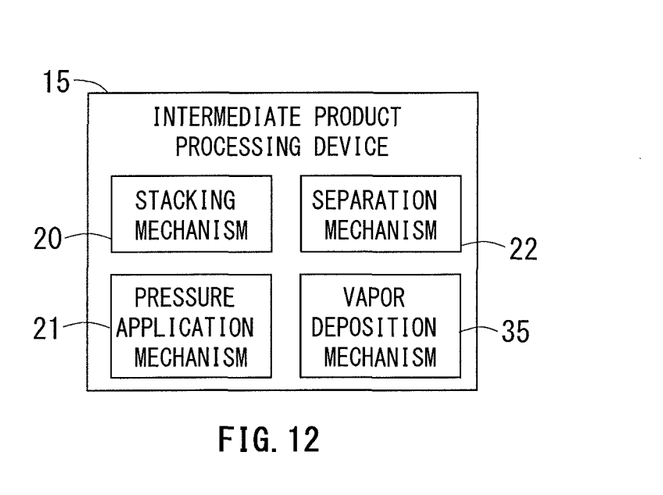
FIG. 12 is a diagram showing an example in which the intermediate product processing device is configured as a vapor deposition device to vapor-deposit a material on a substrate.
Figure 13A:
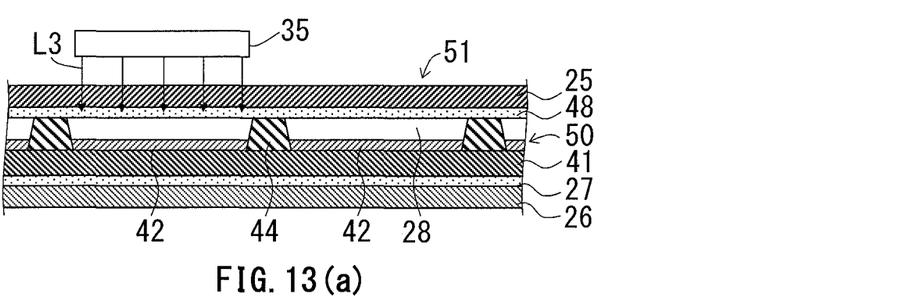
FIG. 13(a), (b) are diagrams showing a vapor deposition step executed by the vapor deposition device shown in FIG. 12.
Figure 13B:
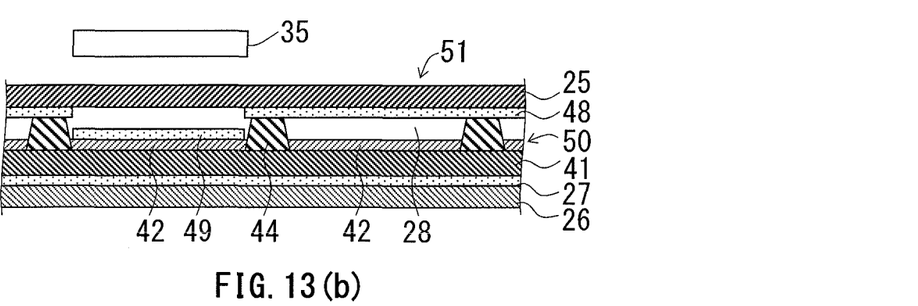

A Modification in which the Intermediate Product Processing Device is Configured as a Vapor Deposition Device In an alternative example, as shown in FIGS. 12, 13(a), and 13(b), the intermediate product processing device 15 may include the stacking mechanism 20, the pressure application mechanism 21, the separation mechanism 22, and a vapor deposition mechanism 35 that vapor-deposits a vapor deposition material 48 on the substrate 41 by irradiating the vapor deposition material 48 with light in the first pressure chamber 21a of the pressure application mechanism 21. In other words, the first pressure applying step in the first pressure chamber 21a, based on the differential pressure, may be used for the vapor deposition step. A method that includes disposing a predetermined material on a flexible member such as the lid member 25, then heating and evaporating the predetermined material, and thereby depositing the material on another member, is called "sublimation transfer" in the field of printing. The terms "evaporation" and "vapor deposition" as used in the description of the present modification can therefore be read to mean "sublimation" and "sublimation transfer", respectively.

In the present modification, as shown in FIG. 13(a), the vapor deposition material 48 is disposed on a side of the lid member 25 that faces the intermediate product 50. In addition, as shown in FIG. 13(a), the intermediate product 50 includes the substrate 41, the plurality of protrusions 44 disposed on the substrate 41, and the first electrode 42 disposed between the protrusions 44. In this case, the vapor deposition material 48 will evaporate when it is irradiated with light L3 such as infrared rays by use of the vapor deposition mechanism 35. More specifically as shown in FIG. 13(a), when a region of the vapor deposition material 48 that is present at a position facing one of the first electrodes 42 is irradiated with the light L3, the vapor deposition material 48 will evaporate and stick to that first electrode 42 on the substrate 41. As a result, a vapor-deposited layer 49 can be formed on the corresponding first electrode 42, as shown in FIG. 13(b). Additionally a space between the substrate 41 and the lid member 25 is appropriately partitioned by the protrusions 44. This prevents the vapor deposition material 48 from being dispersed over a wide region in the space between the substrate 41 and the lid member 25. A method of heating the vapor deposition material 48 is not limited to the method described above. For example, the vapor deposition material 48 may be deposited by forming in advance an infrared-light absorbing metallic thin film on a lower section of the vapor deposition material 48 to heat the metallic thin film. In other words, the step of "irradiating the vapor deposition material 48 with the light L3" in the present modification includes, in addition to the step of irradiating the vapor deposition material 48 directly with the light, emitting the light toward the vapor deposition material 48 so that the light reaches a member adjacent thereto.

Other Modifications

The examples where the organic semiconductor element 40 is an organic electro-luminescence (EL) element have been shown and described in the above embodiment and modifications. These examples, however, do not limit the types of organic semiconductor elements manufactured using the above-described element manufacturing apparatus 10 and element manufacturing method. For example, organic transistor devices, organic solar-cell devices, and other organic semiconductor elements can be manufactured using the element manufacturing apparatus 10 and the element manufacturing method. The organic semiconductor layer and other elements used in an organic transistor device can therefore be known ones, which may be the organic semiconductor layer and other elements described in JP-A-2009-87996. Likewise, the photo-electric conversion layer formed from an organic semiconductor layer, and other elements used in an organic solar-cell device can be known ones, which may be the photo-electric conversion layer and other elements described in JP-A-2011-151195. In addition, the element manufacturing apparatus 10 and the element manufacturing method may be applied to manufacturing inorganic semiconductor elements, as well as to manufacturing organic semiconductor elements.

While several modifications relating to the above-described embodiment have been described, naturally these modifications can also be appropriately combined for application.

DESCRIPTION OF REFERENCE CHARACTERS

10: Element manufacturing apparatus
15: Intermediate product processing device
20: Stacking mechanism
20a: Stacking chamber
21: Pressure application mechanism
21a: First pressure chamber
22: Separation mechanism
22a: Separation chamber
22e: Separation roller
25: Lid member
26: Support member
28: Enclosed space
30: Removal mechanism
31: Light irradiator
40: Organic semiconductor element
41: Substrate
42: First electrode
43: Auxiliary electrode
44: Protrusion
45: Organic semiconductor layer
46: Second electrode
50: Intermediate product
51: Stacked structure

The invention claimed is:

1. An element manufacturing method for processing a substrate that extends from one roll to another roll, the method comprising the steps of:
   providing an intermediate product that includes the substrate and a protrusion extending in a normal direction of the substrate;
   forming a stacked structure by continuously stacking a lid member on the intermediate product at a side where the protrusion is provided, in a stacking chamber conditioned to a vacuum environment;
   transporting the stacked structure from the stacking chamber to a first pressure chamber coupled to the stacking chamber and conditioned to a first pressure higher than a pressure existing in the vacuum environment;
   further transporting the stacked structure from the first pressure chamber to a separation chamber coupled to the first pressure chamber and conditioned to a vacuum environment; and
   separating the stacked structure into the intermediate product and the lid member, in the separation chamber;
   wherein, when viewed in a cross section of the stacked structure taken along a plane orthogonal to a direction in which the stacked structure is transported, a space between the intermediate product and the lid member is hermetically sealed from surroundings by the differential pressure in the respective chambers after the step of transporting the stacked structure.

2. The element manufacturing method according to claim 1, wherein:
   the stacked structure further includes a support member continuously stacked on the intermediate product at a side opposite to the side where the protrusion is provided; and
   the lid member and the support member are bonded together at said cross section of the stacked structure.

3. The element manufacturing method according to claim 1, wherein:
   the element includes
      the substrate,
      a plurality of first electrodes each disposed on the substrate,
      an auxiliary electrode and the protrusion, both disposed between the first electrodes,
      an organic semiconductor layer disposed on the first electrode, and
      a second electrode disposed on the organic semiconductor layer and the auxiliary electrode; and
   the intermediate product includes
      the substrate,
      the plurality of first electrodes disposed on the substrate,
      the auxiliary electrode and protrusion disposed between the first electrodes, and
      the organic semiconductor layer disposed on the first electrode and the auxiliary electrode;

the element manufacturing method further comprising a removing step for removing the organic semiconductor layer disposed on the auxiliary electrode, in the first pressure chamber.

4. The element manufacturing method according to claim 3, wherein:
the auxiliary electrode is partly covered with the protrusion; and
the removing step includes the step of irradiating with light the organic semiconductor layer on the auxiliary electrode disposed adjacently to the protrusion.

5. The element manufacturing method according to claim 3, wherein:
the protrusion is at least partly covered with the auxiliary electrode; and
the organic semiconductor layer on the auxiliary electrode positioned on the protrusion is removed in the removing step.

6. The element manufacturing method according to claim 1, wherein:
the intermediate product includes the substrate, and the protrusion and a layer to be exposed to light, which are disposed on the substrate;
the element manufacturing method further comprising an exposure step for irradiating with exposure light the layer to be exposed to light in the first pressure chamber.

7. The element manufacturing method according to claim 1, wherein:
a vapor deposition material is disposed on a surface of the lid member that faces the intermediate product;
the element manufacturing method further comprising a step of vapor-depositing the vapor deposition material on the substrate by irradiating the vapor deposition material with light in the first pressure chamber.

8. An element manufacturing apparatus for processing a substrate that extends from one roll to another roll, the apparatus comprising:
a stacking mechanism that forms a stacked structure by continuously stacking a lid member on an intermediate product that includes the substrate and a protrusion extending in a normal direction of the substrate, the lid member being stacked on the intermediate product at a side where the protrusion is provided;
a pressure application mechanism that includes a first pressure chamber, the first pressure chamber being coupled to a stacking chamber, conditioned to a first pressure higher than a pressure existing in a vacuum environment, and configured to accept the stacked structure transported from the stacking chamber; and
a separation mechanism that separates the stacked structure into the intermediate product and the lid member in a separation chamber, the separation chamber being coupled to the first pressure chamber, conditioned to a vacuum environment, and configured to accept the stacked structure transported from the first pressure chamber;
wherein, when viewed in a cross section of the stacked structure taken along a plane orthogonal to a direction in which the stacked structure is transported, a space between the intermediate product and the lid member is hermetically sealed from surroundings by the differential pressure in the respective chambers after the stacked structure is transported.

9. The element manufacturing apparatus according to claim 8, wherein:
the stacked structure further includes a support member continuously stacked on the intermediate product at a side opposite to the side where the protrusion is provided; and
the lid member and the support member are bonded together at said cross section of the stacked structure.

10. The element manufacturing apparatus according to claim 8, wherein:
the element includes
the substrate,
a plurality of first electrodes each disposed on the substrate,
an auxiliary electrode and the protrusion, both disposed between the first electrodes,
an organic semiconductor layer disposed on the first electrode, and
a second electrode disposed on the organic semiconductor layer and the auxiliary electrode; and
the intermediate product includes
the substrate,
the plurality of first electrodes disposed on the substrate,
the auxiliary electrode and protrusion disposed between the first electrodes, and
the organic semiconductor layer disposed on the first electrode and the auxiliary electrode;
the element manufacturing apparatus further comprising a removal mechanism that removes the organic semiconductor layer disposed on the auxiliary electrode, in the first pressure chamber.

11. The element manufacturing apparatus according to claim 10, wherein:
the auxiliary electrode is partly covered with the protrusion; and
the removal mechanism includes a light irradiator that irradiates with light the organic semiconductor layer on the auxiliary electrode disposed adjacently to the protrusion.

12. The element manufacturing apparatus according to claim 10, wherein:
the protrusion is at least partly covered with the auxiliary electrode; and
the removal mechanism is configured to remove the organic semiconductor layer on the auxiliary electrode positioned on the protrusion.

13. The element manufacturing apparatus according to claim 8, wherein:
the intermediate product includes the substrate, and the protrusion and a layer to be exposed to light, which are disposed on the substrate;
the element manufacturing apparatus further comprising an exposure mechanism that irradiates with exposure light the layer to be exposed to light in the first pressure chamber.

14. The element manufacturing apparatus according to claim 8, wherein:
a vapor deposition material is disposed on a surface of the lid member that faces the intermediate product;
the element manufacturing apparatus further comprising a vapor-deposition mechanism that vapor-deposits the vapor deposition material on the substrate by irradiating the vapor deposition material with light in the first pressure chamber.

* * * * *